(12) United States Patent
Haba et al.

(10) Patent No.: US 9,196,581 B2
(45) Date of Patent: Nov. 24, 2015

(54) FLOW UNDERFILL FOR MICROELECTRONIC PACKAGES

(71) Applicant: Tessera, Inc., San Jose, CA (US)

(72) Inventors: Belgacem Haba, Saratoga, CA (US); Ilyas Mohammed, Santa Clara, CA (US); Ellis Chau, San Jose, CA (US); Sang Il Lee, San Jose, CA (US); Kishor Desai, Fremont, CA (US)

(73) Assignee: Tessera, Inc., San Jose, CA (US)

( * ) Notice: Subject to any disclaimer, the term of this patent is extended or adjusted under 35 U.S.C. 154(b) by 20 days.

(21) Appl. No.: 14/252,197

(22) Filed: Apr. 14, 2014

(65) Prior Publication Data

US 2014/0217584 A1  Aug. 7, 2014

Related U.S. Application Data

(62) Division of application No. 12/938,068, filed on Nov. 2, 2010, now Pat. No. 8,697,492.

(51) Int. Cl.
*H01L 23/488*  (2006.01)
*H01L 23/498*  (2006.01)
(Continued)

(52) U.S. Cl.
CPC ........ *H01L 23/49811* (2013.01); *H01L 21/563* (2013.01); *H01L 24/16* (2013.01); *H01L 24/73* (2013.01); *H01L 24/92* (2013.01); *H01L 24/13* (2013.01); *H01L 24/29* (2013.01); *H01L 24/32* (2013.01); *H01L 24/81* (2013.01); *H01L 24/83* (2013.01); *H01L 2224/131* (2013.01);
(Continued)

(58) Field of Classification Search
USPC ........................................ 257/737, 777, 778

IPC ....................... H01L 24/12,24/15, 24/28, 24/31
See application file for complete search history.

(56) References Cited

U.S. PATENT DOCUMENTS 5,640,052 A * 6/1997 Tsukamoto ................... 257/781
6,229,220 B1  5/2001 Saitoh et al.
(Continued)

FOREIGN PATENT DOCUMENTS

JP       2008219052 A       9/2008

OTHER PUBLICATIONS

International Search Report and Written Opinion for application PCT/US2011/058080 dated May 16, 2012.
(Continued)

*Primary Examiner* — Marcos D Pizarro
(74) *Attorney, Agent, or Firm* — Lerner, David, Littenberg, Krumholz & Mentlik, LLP

(57) ABSTRACT

A microelectronic assembly includes a first component with first conductive elements; a second component with second conductive elements; a bond metal; and an underfill layer. The posts have a height above the respective surface from which the posts project. A bond metal can be disposed between respective pairs of conductive elements, each pair including at least one of the posts and at least one of the first or second conductive elements confronting the at least one post. The bond metal can contact edges of the posts along at least one half the height of the posts. An underfill layer contacts and bonds the first and second surfaces of the first and second components. A residue of the underfill layer may be present at at least one interfacial surfaces between at least some of the posts and the bond metal or may be present within the bond metal.

20 Claims, 20 Drawing Sheets

(51) Int. Cl.
  *H01L 21/56* (2006.01)
  *H01L 23/00* (2006.01)
(52) U.S. Cl.
  CPC ............... *H01L2224/13109* (2013.01); *H01L 2224/13111* (2013.01); *H01L 2224/1601* (2013.01); *H01L 2224/1605* (2013.01); *H01L 2224/16225* (2013.01); *H01L 2224/1703* (2013.01); *H01L 2224/73104* (2013.01); *H01L 2224/73204* (2013.01); *H01L 2224/814* (2013.01); *H01L 2224/81143* (2013.01); *H01L 2224/81193* (2013.01); *H01L 2224/81815* (2013.01); *H01L 2224/8349* (2013.01); *H01L 2224/83191* (2013.01); *H01L 2224/83192* (2013.01); *H01L 2224/83193* (2013.01); *H01L 2924/014* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01049* (2013.01)

USPC ..................... 257/777; 257/737; 257/778

(56) References Cited

U.S. PATENT DOCUMENTS

| | | | |
|---|---|---|---|
| 7,569,935 B1 * | 8/2009 | Fan .................. | 257/737 |
| 2002/0173075 A1 | 11/2002 | Tie et al. | |
| 2003/0080437 A1 * | 5/2003 | Gonzalez et al. ......... | 257/778 |
| 2004/0094842 A1 | 5/2004 | Jimarez et al. | |
| 2007/0200249 A1 | 8/2007 | Tanida et al. | |
| 2007/0228543 A1 * | 10/2007 | Walter et al. ............ | 257/686 |
| 2009/0188706 A1 | 7/2009 | Endo | |
| 2009/0258460 A1 * | 10/2009 | Oi et al. .................. | 438/108 |

OTHER PUBLICATIONS

Taiwanese Office Action for Application No. 100139205 dated Dec. 2, 2014.

* cited by examiner (e)

(f)

(a)

(b)

(c)

(d)

(e)

(f)

(e)

(f)

(e)

(f)

(d)

(e)

(f)

FLOW UNDERFILL FOR MICROELECTRONIC PACKAGES

CROSS-REFERENCE TO RELATED APPLICATIONS

The present application is a divisional of U.S. patent application Ser. No. 12/938,068, filed Nov. 2, 2010, which issued as U.S. Pat. No. 8,697,492 on Apr. 15, 2014, the disclosure of which is incorporated herein by reference.

BACKGROUND OF THE INVENTION

In the construction of semiconductor chip package assemblies, it has been found desirable to interpose encapsulant material or an underfill between and/or around elements of semiconductor packages in an effort to reduce and/or redistribute the strain and stress on the connections between the semiconductor chip and a supporting circuitized substrate or dielectric element during operation of the chip, and to seal the elements against corrosion, as well as to insure intimate contact between the encapsulant, the semiconductor die and the other elements of the chip package.

Various methods have been devised to encapsulate semiconductor chip package assemblies and the like. Nevertheless, despite all of the effort which has been devoted to development of microelectronic encapsulation techniques, there are unmet needs for further improvements.

SUMMARY OF THE INVENTION

A method for making a microelectronic assembly can include providing a first component having a first surface and first conductive elements projecting above the first surface, and a second component having a second surface and second conductive elements projecting above the second surface. At least one of the first or second components may be a microelectronic element, at least some of the first conductive elements or at least some of the second conductive elements may be being substantially rigid conductive posts, and the posts may have a height above the respective surface from which the posts project of at least forty percent of a distance between the first and second surfaces. A bond metal may be disposed on at least either the at least some first conductive elements or the second conductive elements, and an underfill layer may overlie at least some of the first conductive elements or at least some of the second conductive elements. The method may include moving at least one of the first conductive elements towards another of the second conductive elements such that the substantially rigid posts pierce the underfill layer and at least deform the bond metal. The method may include heating the first and second components to a joining temperature until the bond metal flows along edges of the posts and electrically joins the first and second components. The bond metal may contact the edges along at least one half the height of the posts.

In another aspect of the present invention, a method for making a microelectronic assembly can include providing a microelectronic element having a first surface and first conductive elements projecting above the first surface, and a dielectric element having a second surface and second conductive elements projecting above the second surface. At least some of the first conductive elements or at least some of the second conductive elements may be a substantially rigid conductive posts, and the other of the first or second conductive elements may include a bond metal juxtaposed with the at least some conductive posts. The posts may have a height above the respective surface from which the posts project, and an underfill layer overlying at least some of the first conductive elements or at least some of the second conductive elements. The method may include moving at least one of the first conductive elements towards the other of the second conductive elements such that the substantially rigid posts pierce the underfill layer and at least deform the bond metal. The method may include heating the microelectronic element and the dielectric element to a joining temperature until the bond metal flows along edges of the posts to contact the edges along at least one half the height of the posts and electrically joins the microelectronic element with the dielectric element. The height of the posts above the surface from which they project may be at least forty percent of a distance between the first and second surfaces.

In one embodiment, the first conductive elements include the bond metal and the at least some conductive posts are second conductive elements of the dielectric element.

In one embodiment, the at least some posts are first conductive elements of the microelectronic element and the second conductive elements include the bond metal.

In one embodiment, the step of moving at least one of the first conductive posts towards the other of the second conductive elements includes the substantially rigid posts piercing the bond metal.

In one embodiment, the step of moving at least one of the first conductive elements toward the other includes penetrating the bond metal to a depth of at least 25% of a height of the solder above the respective one of the first or second surfaces.

In one embodiment, prior to the step of deforming the bond metal, trace amounts of the underfill layer are pushed into the bond metal by the conductive posts.

In one embodiment, the first component may be a chip or an interconnection element.

In one embodiment, the first and second components may be chips or the second component may be an interconnection element.

In one embodiment, at least some of the first conductive elements may be substantially rigid posts; or at least some of the first conductive elements may be conductive pads; or at least some of the second conductive elements may be substantially rigid posts; or at least some of the second conductive elements may be contact pads.

In one embodiment, the underfill may overlie the first conductive elements; or the underfill may overlie the second conductive elements; or the underfill may overlie the first and second conductive elements.

In one embodiment, the first component may be a microelectronic element, at least some of the first conductive elements may be contact pads, and at least some of the second conductive elements are substantially rigid posts. Alternatively, the second component may be an interconnection element or a microelectronic element. In another alternate embodiment, the step of providing may include providing a bond metal on the at least some of the substantially rigid posts or providing a bond metal on the at least some of the contact pads.

In one embodiment, the first component may be a microelectronic element, at least some of the first conductive elements may be substantially rigid posts, and at least some of the second conductive elements may be contact pads. Alternatively, the second component may be an interconnection element or a microelectronic element.

In one embodiment, the first component may be a microelectronic element, at least some of the first conductive elements may be substantially rigid posts, and at least some of the second conductive elements may be substantially rigid posts. Alternatively, the second component may be an interconnection element or a microelectronic element.

In accordance with another aspect of invention, a microelectronic assembly may include a first component, a second component, a bond metal, and an underfill layer. The first component may have a first surface and first conductive elements projecting above the first surface. The second component may have a second surface and second conductive elements projecting above the second surface. The at least one of the first or second components may be a microelectronic element, at least some of the first conductive elements or at least some of the second conductive elements may be substantially rigid conductive posts and may have a height above the respective surface from which the posts project. The bond metal may be disposed between respective pairs of conductive elements, the respective pairs each including at least one of the posts and at least one of the first or second conductive elements confronting the at least one post. The bond metal may also contact edges of the posts along at least one half the height of the posts. The underfill layer may contact and bond the first and second surfaces of the first and second components. A residue of the underfill layer may be present at at least one of interfacial surfaces between at least some of the posts and the bond metal, or the residue of the underfill layer may be present within the bond metal.

In one embodiment, the first component may be a microelectronic element and the second component may be a dielectric element. Alternatively, the microelectronic element may be a chip.

In one embodiment, the first component may be a dielectric element.

In one embodiment, the first component and the second component may be microelectronic elements; or the first conductive elements may be the conductive posts.

In one embodiment, the second conductive elements may be the conductive posts.

In one embodiment, both the first conductive elements and the second conductive elements may be the conductive posts.

In one embodiment, a bonding metal may be deposited on at least one of the conductive posts.

In one embodiment, a solder mask may be provided adjacent the conductive posts; or at least a portion of the conductive posts may be coated with a material resistant to a bonding metal.

In one embodiment, the bond metal may cover one half or less of a height of at least one of the conductive posts.

In one embodiment, the second conductive elements may be the conductive posts.

DETAILED DESCRIPTION

Figure 1:
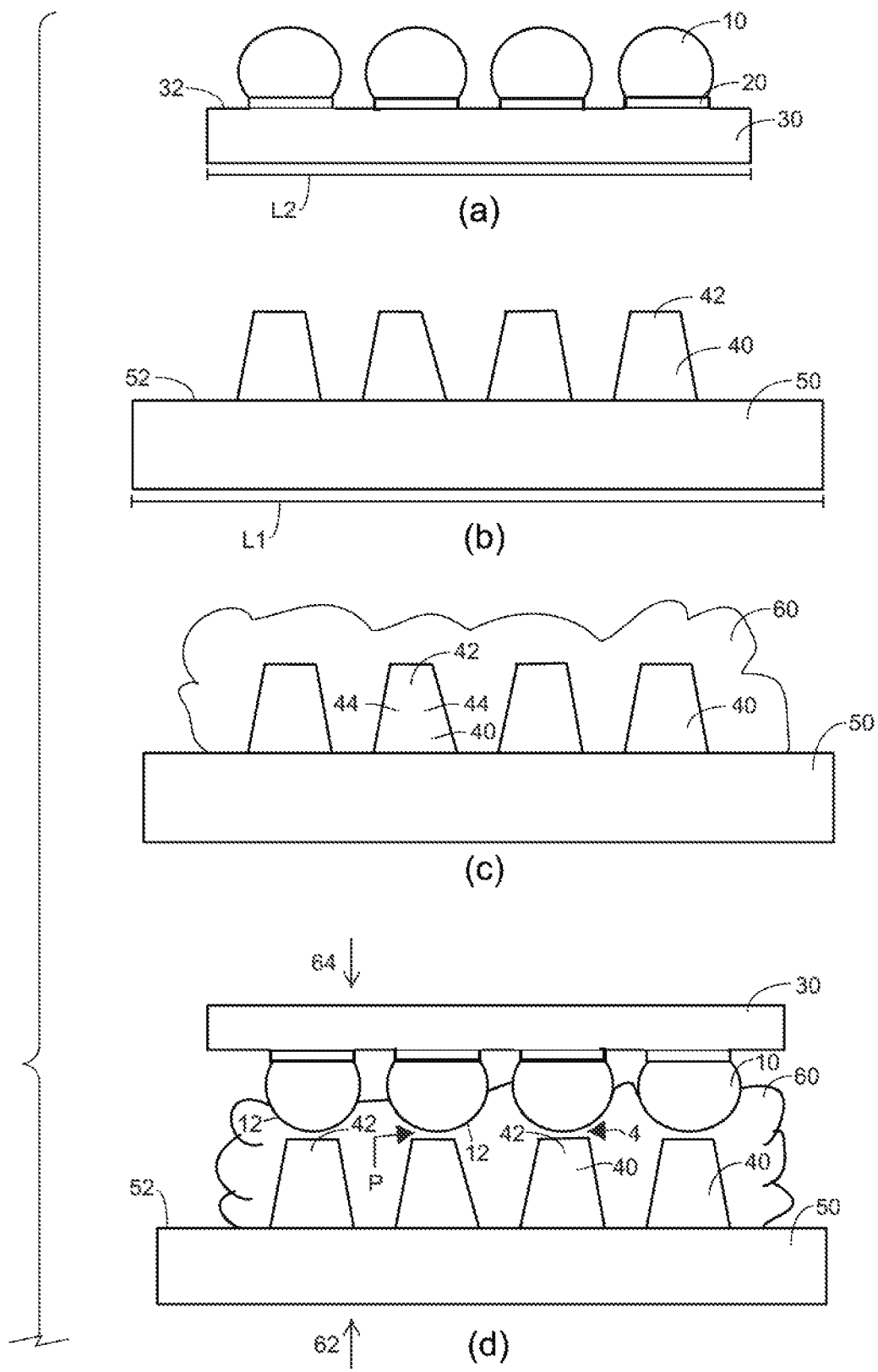
FIG. 1(a-f) is an embodiment in accordance with one embodiment of the present invention.
Figure 1:
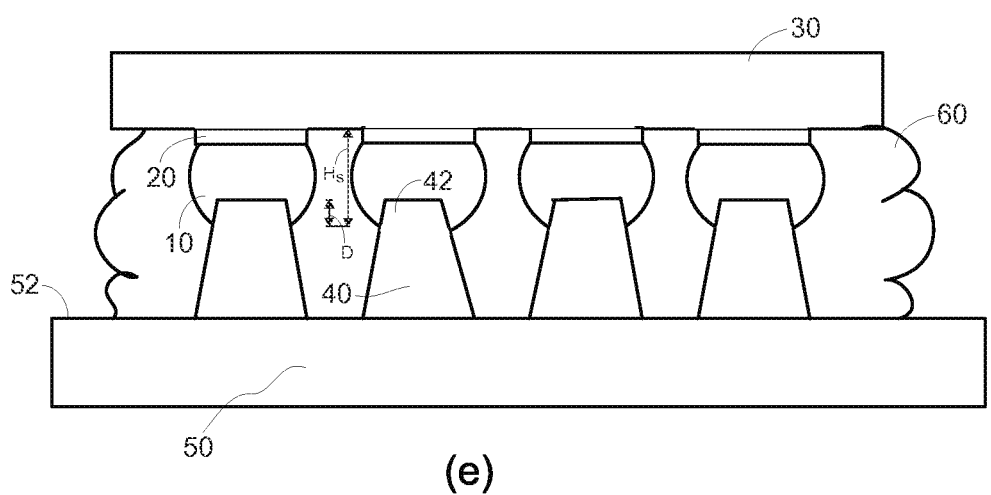
Figure 1:
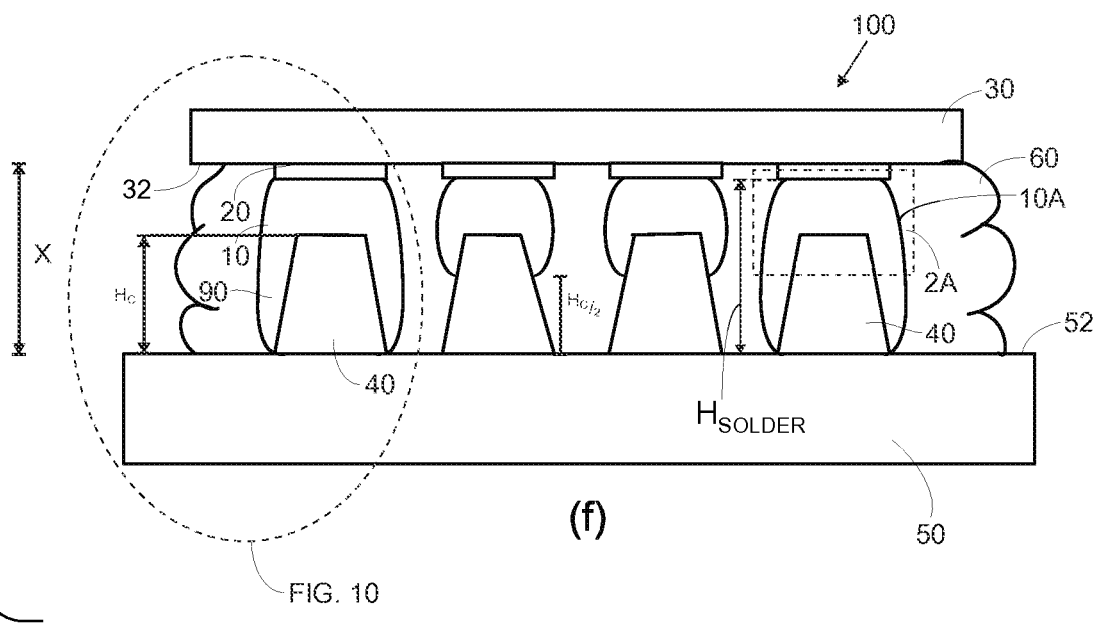

FIG. 1 is a sectional view of a method of preparing a microelectronic package 100 (FIG. 1(f)) in accordance with an embodiment of the present invention. As shown, the microelectronic package 100 includes a microelectronic element 30 and a dielectric element 50 with conductive posts 40 exposed thereat. (FIGS. 1(a)-(b).)

Referring to FIG. 1(a), in one example, the microelectronic element 30 can be a single "bare", i.e., unpackaged die, e.g., a semiconductor chip having microelectronic circuitry thereon. A plurality of contacts, e.g., bond pads 20 can be exposed at a contact-bearing surface 32 of a semiconductor die and may be arranged in one or more rows exposed at such surface.

As used in this disclosure, a statement that an electrically conductive element is "exposed at" a surface of a dielectric element indicates that the electrically conductive element is available for contact with a theoretical point moving in a direction perpendicular to the surface of the dielectric element toward the surface of the dielectric element from outside the dielectric element. Thus, a terminal or other conductive element which is exposed at a surface of a dielectric element may project from such surface; may be flush with such surface; or may be recessed relative to such surface and exposed through a hole or depression in the dielectric element.

A bond metal 10, such as solder, indium, tin, or a combination thereof, for example, may be joined to bond pads 20 of the microelectronic element 30.

Referring to FIG. 1(b), in one embodiment, a dielectric element 50, such as for example, a substrate, chip carrier, tape, etc. may be provided that has conductive elements exposed at a surface thereof. In one embodiment, the dielectric element 50 has a length L1 that is greater than the length L2 of the microelectronic element. Alternatively, the lengths of the dielectric and microelectronic elements can be the same. In the embodiment shown, the conductive elements are substantially rigid metal posts 40 extending above or outwardly from the top surface 52 of the dielectric element 50. The posts 40 may be prepared using any methods known in the art.

For example, as described in U.S. Pat. No. 6,177,636 to Fjelstad, the disclosure of which is incorporated herein by reference, a plurality of substantially rigid, elongated posts protruding parallel to one another from a surface of a substrate can be formed by attaching a conductive sheet to a substrate surface and then selectively removing portions of the conductive sheet. The metal sheet can consist essentially of copper or may have one or more layers of copper and possibly one or more layers of another metal therein, e.g., an etching barrier metal such as nickel. The tips of the posts may have coplanar surfaces.

Thus, for example, substantially rigid posts may be patterned by lithography from a conductive sheet attached to dielectric element 50 to form solid metal posts extending upwardly above the top surface 52 of the dielectric element 50. Such processing tends to form metal posts which have a frustoconical shape, wherein edges of the posts are sloped away from the tips 42 of the conductive posts 40. Similarly, the posts may be formed from a double etching process, such as disclosed in commonly assigned U.S. Patent Application Publication No. 2008/0003402, filed on Mar. 13, 2007, the disclosure of which is incorporated herein by reference. Alternatively, the posts can be formed as disclosed in commonly assigned U.S. Patent Application Publication No. 2010/0044860 to Haba, filed on Jul. 30, 2009; or U.S. Patent Application Publication No. 2009/0188706 to Endo, filed on Dec. 23, 2008, of which all of the disclosures are incorporated herein by reference.

In addition, electrolytic plating methods for forming posts on a metal substrate are described in U.S. Pat. Nos. 6,372,620 and 6,617,236, each to Oosawa et al., the disclosures of which are incorporated herein by reference. Unlike etching processes in which exposed portions of a conductive layer on a substrate are removed, substantially rigid conductive posts can be formed by depositing metal on the exposed portions of the substrate. Such posts may instead have a more uniform circular shape, as opposed to a frustoconical shape that results from the etching process.

Figure 2:
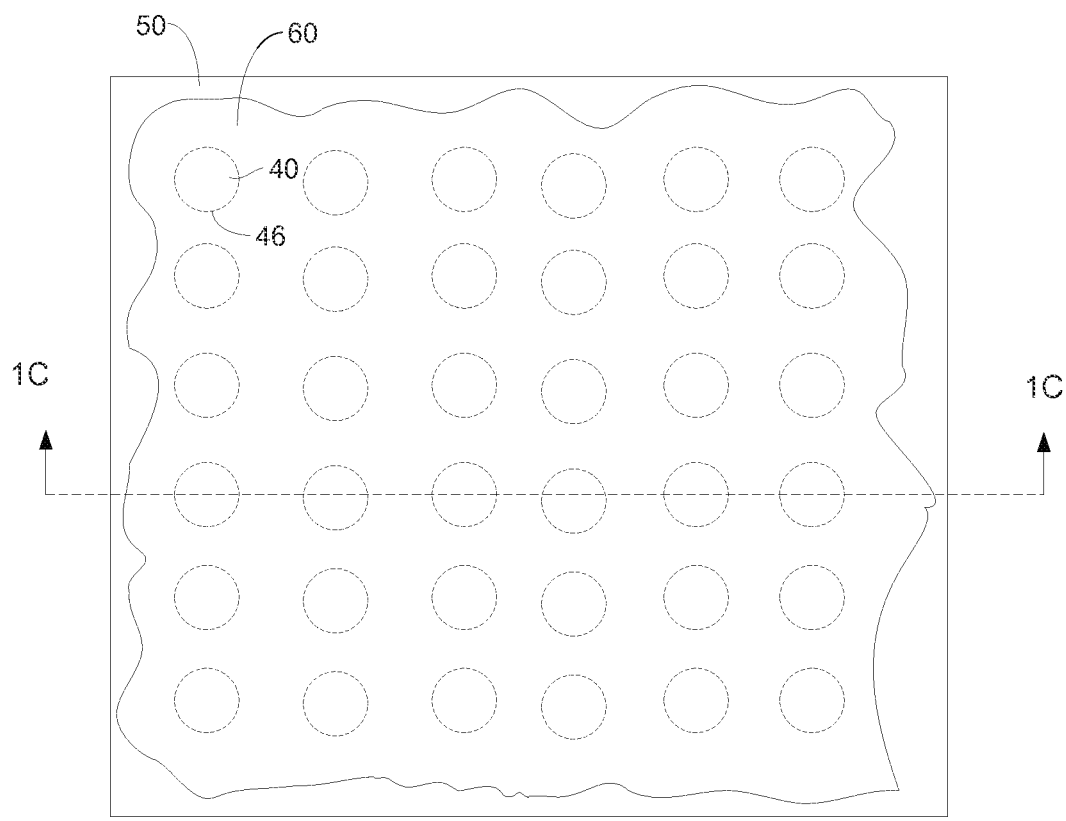
FIG. 2 is a top view of FIG. 1(c).

Referring to FIG. 1(c), a pre-determined amount of underfill can be deposited onto the dielectric element 50 so that the underfill 60 covers the exposed top surface 52 of the dielectric element 50 and posts 40. In one exemplary embodiment, the underfill 60 can be spin coated over the top surface 52 of the dielectric element 50 and top surfaces or tips 42 of the posts 40. The edge surfaces and tips 42 of the conductive posts may contact the underfill 60 so that the posts are fully covered by the underfill. (See FIGS. 1(c) and 2.) The underfill can include a polymeric component, which, after final package assembly and casing thereof, increases a rigidity of the mechanical connection between the microelectronic and dielectric elements 30, 50.

Referring now to FIG. 1(d), the masses of bonding metal, e.g., solder 10 on the microelectronic element 30 can be juxtaposed with the conductive posts 40 extending away from the dielectric element 50. In the embodiment shown, the masses of solder 10 can be moved toward the conductive posts 40, i.e., by moving the microelectronic element towards the substrate. Alternatively, the substrate with the conductive posts 40 thereon can be moved toward the solder masses 10 of the microelectronic element, or both the solder and conductive posts can be moved closer to one another. For example, the die 30 and the dielectric element 50 can be placed on respective plates (not shown) and the conductive posts 40 and solder 10 can be moved closer together by moving one or both of the microelectronic element 30 or dielectric element 50 in one or both of directions 62,64. To ensure mating of the conductive posts 40 with the solder 10, the solder 10 may be pressed into the underfill 60 so as to at least deform a portion of the underfill 60. In such arrangement, the underfill 60 may contact the top surface 52 of the dielectric element 50 and edge surfaces 44 of the solder 10, but may or may not contact the contact-bearing surface of the microelectronic element 30. In a particular embodiment, the method may include a step to align the conductive posts with the masses of bonding metal. However, in some cases, it may be possible to join the posts of the dielectric element with the bonding metal on the microelectronic element without requiring a step of aligning the posts with the bonding metal. That is, the bonding metal may have a tendency to self-align the structures when the bonding metal is heated to a temperature at which it liquefies, at which time surface tension from the masses of bonding metal can help bring the conductive posts in better alignment with the masses of bonding metal.

Turning now to FIG. 1(e), the microelectronic element 30 can continue being moved toward the dielectric element 50 so that the tips 42 of the conductive posts 40 become embedded within the underfill 60. The tips 42 will also at least deform at least a portion of the solder 10, if not fully penetrate the solder 10. In one embodiment, the conductive posts 40 penetrate at least a distance D (FIG. 1(e)) which is at least 25% of the height $H_s$ (FIG. 1(a)) of the solder 10 extending away from the contact-bearing surface 32 of the microelectronic element 30. For example, if the height of the solder 10 is 100 microns above the surface of the microelectronic element 30, the conductive post can penetrate into the solder 10 at least 25 microns.

As compared with prior art microelectronic packages, penetration of the underfill 60 and deformation and/or penetration of the solder 10 by the conductive posts 40 can be made possible by the substantial rigidity and sharp edges 46 (FIGS. 1 and 2) of the conductive posts 40. The structure of the conductive posts 40 enable them to puncture or push through the underfill 60 and at least deform solder 10, if not become embedded in the solder 10. Once the conductive posts have penetrated the underfill and at least deform a portion of the solder 10, the underfill 60 can contact both the contact-bearing surface 32 of the microelectronic element, as well as the top surface 52 of the dielectric element 50. In alternative embodiments, in order to become embedded in the underfill 60 and solder 10, the dielectric element 50 can be moved toward the microelectronic element 30, or the microelectronic element 30 and the dielectric element 50 can be moved toward each other at the same time.

Referring now to FIG. 1(f), after the solder 10 and conductive posts 40 have been joined together, the overall microelectronic package 100 may be heated to a reflow temperature so that the solder 10 may flow around the edges of the conductive post 40 to form a conductive column 90. In an exemplary embodiment, the solder will wet the conductive post a height Hc/2 that is at least 50% of the total height Hc of the conductive post. In a particular embodiment, the solder may cover the post to the exposed surface 52 of the dielectric element or may cover any portion of the conductive post 40 between the height HC/2 and the portion of the top surface 52 of the dielectric element 50 adjacent the post.

As shown, the height $H_e$ of the conductive posts 40, the height $H_{solder}$ of the solder column 10A, and the bond pads 20 may contribute toward a separation distance X between the contact-bearing surface 32 of the microelectronic element and the top surface 52 of the dielectric element 50. In an exemplary embodiment, the height $H_c$ of the conductive posts 40 is at least forty percent (40%) of a separation distance X between the top surface 52 of the dielectric element 50 and the contact-bearing surface 32 of the microelectronic element 30. In one example, where the distance X can be 25 to 100 microns, the conductive posts 40 have a height $H_c$ of at least 10 microns. It is to be appreciated that the distance X may be taken between exposed top surfaces of elements that may be provided on top of the contact bearing surface 32 of the microelectronic element and the top surface of an element provided on the top surface of a dielectric element, such as a solder mask, adhesive layer, or any other material that covers the exposed surfaces of the dielectric element or contact bearing surface 32 of the microelectronic element.

Figure 2A:
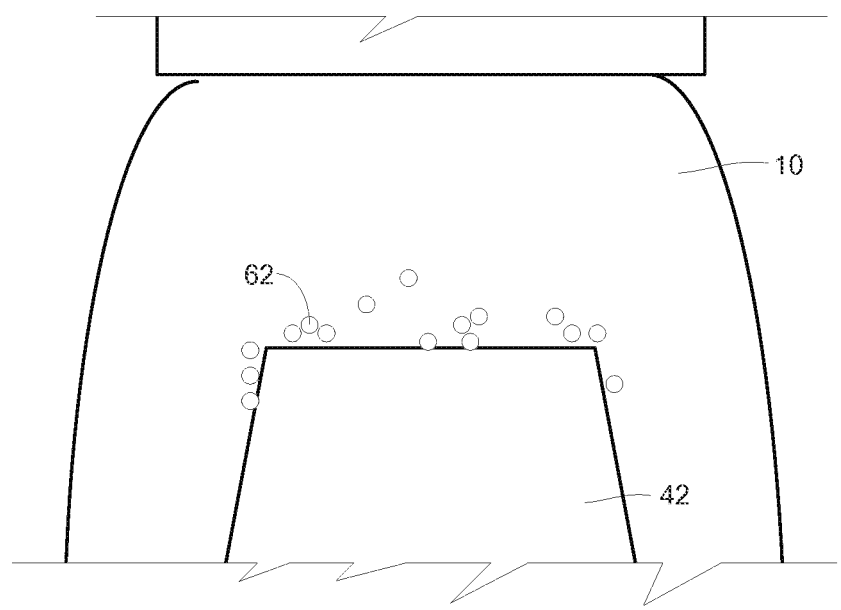
FIG. 2A is an exploded view of a portion of FIG. 1(f).

Referring to FIG. 2A, an enlarged schematic view of a tip of one of the conductive posts in FIG. 1(f) is shown. As shown in exaggerated detail, at the joint between the solder 10 and conductive posts, residual traces 62 of underfill 60 will be present in the solder 10. The residual traces 62 of underfill 60 may be present or mixed in with the solder 10 when the conductive post 40 and/or the solder 10 are pressed toward one another. Referring back to FIG. 1(d), when the conductive post 40 and solder are juxtaposed with one another, a portion P of underfill 60 is positioned between the solder 10 and tip 42 of the conductive post 40. As the dielectric element 50 and microelectronic element 30 are moved closer to one another (FIGS. 1(d) and 1(e)) and the conductive post 40 becomes embedded within the solder 10, traces (not shown) of the underfill 60 that were positioned between the solder 10 and conductive post 40 will also become embedded within the solder 10. In effect, the conductive posts 40 may push the underfill 60 into the solder 10. These trace portions 62 will appear at the juncture between the conductive post 40 and solder 10.

Figure 6:
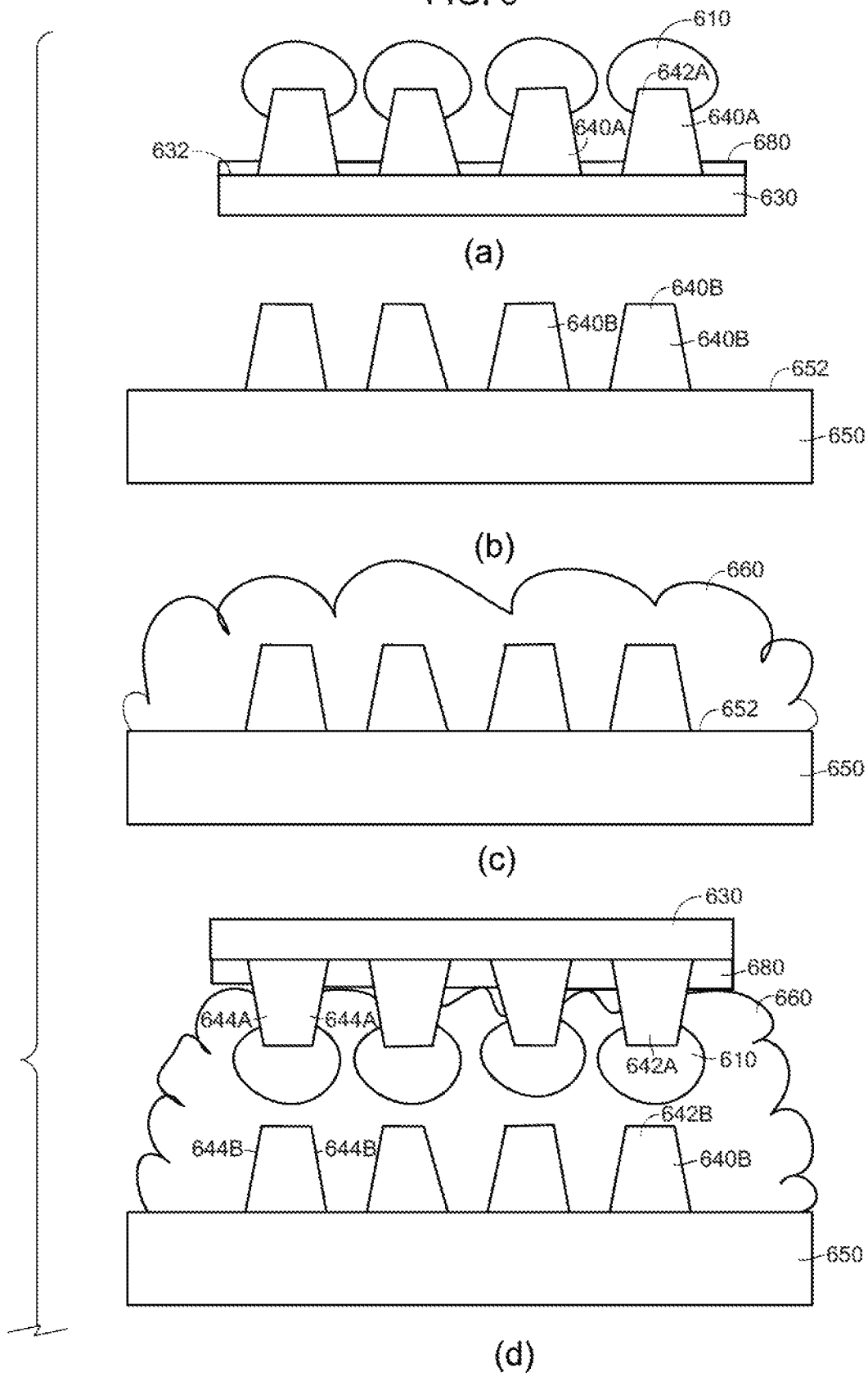
FIG. 6(a-f) is another alternate embodiment of FIG. 1.
Figure 6:
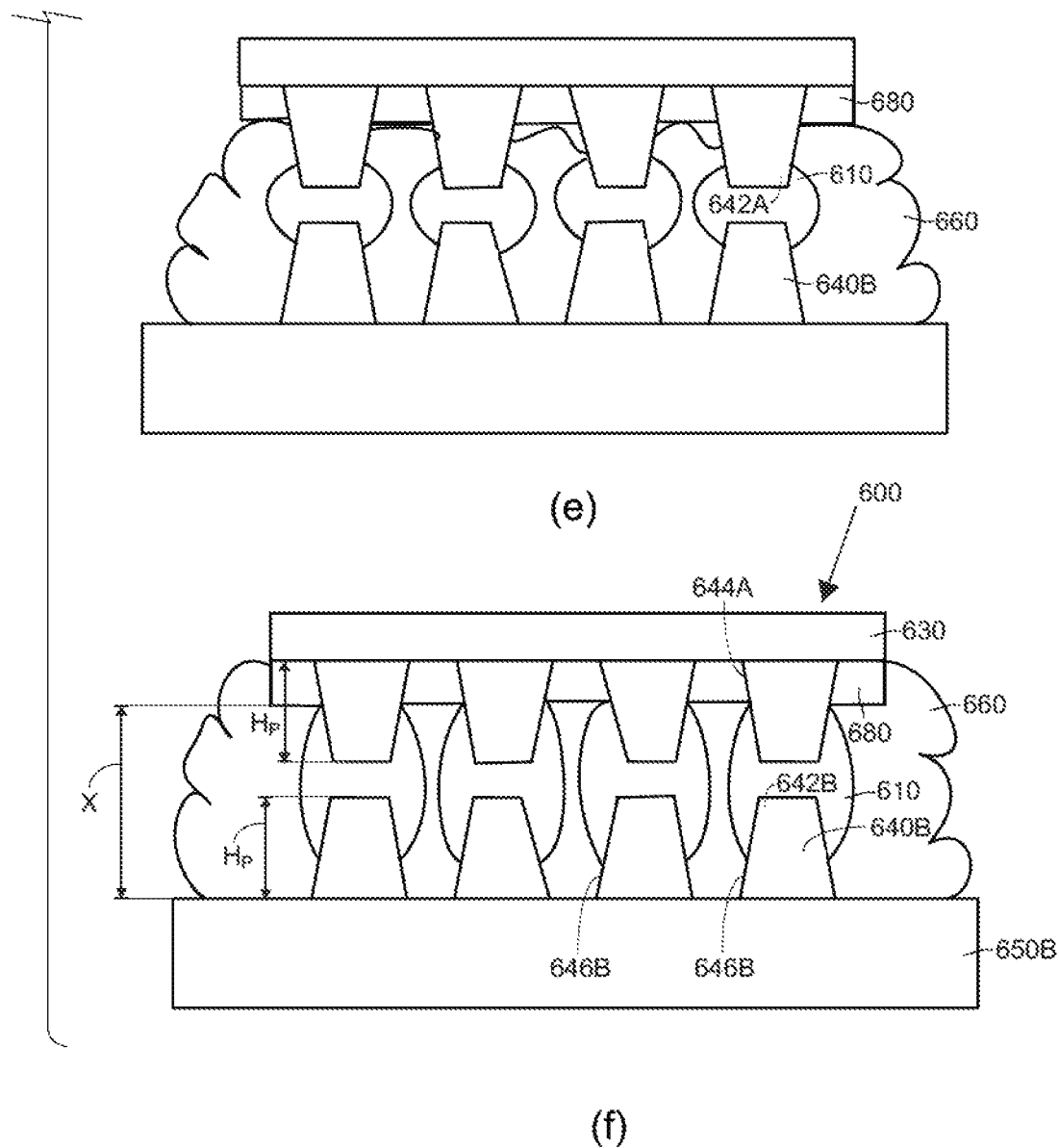
Figure 8:
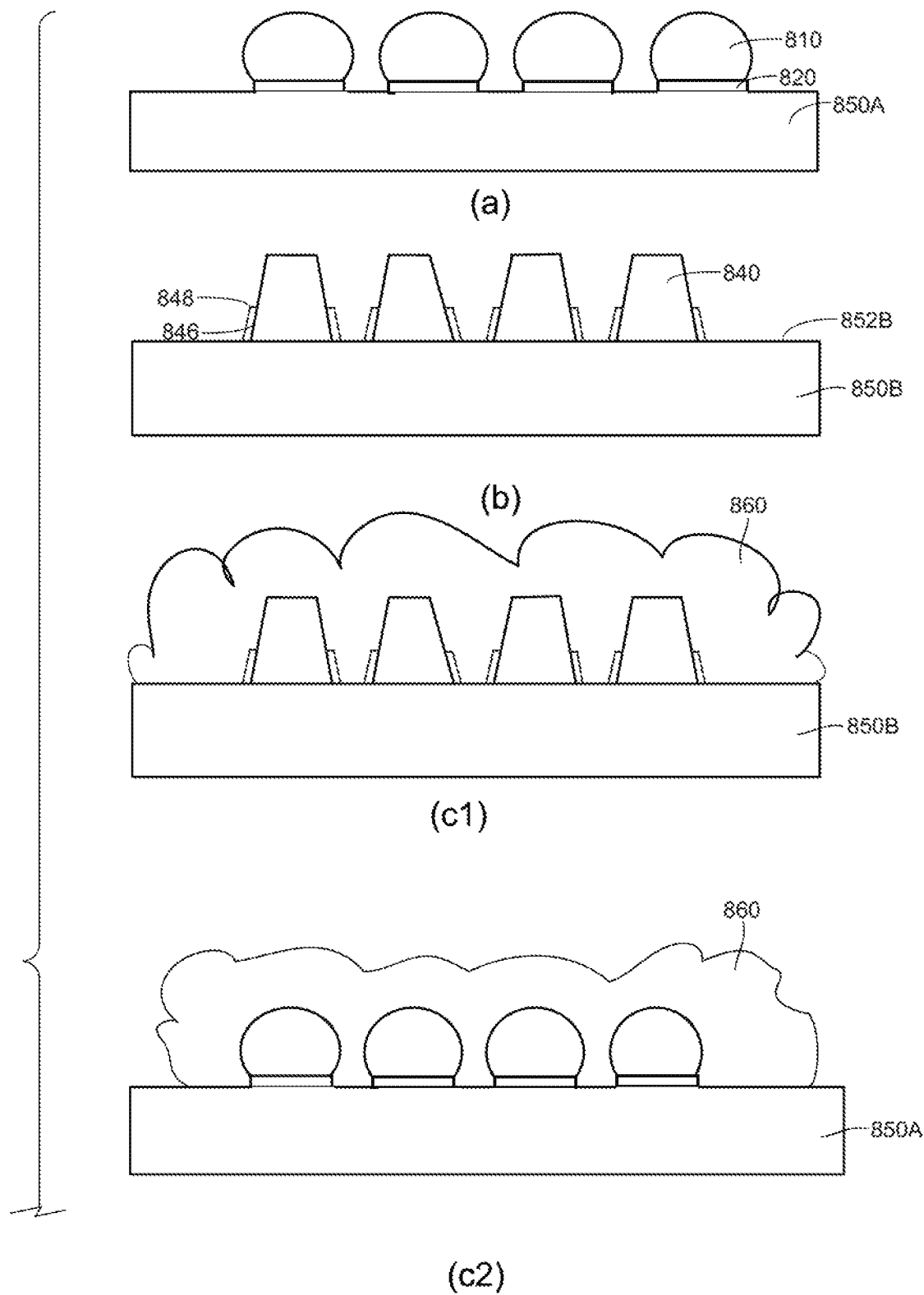
FIG. 8(a-f) is another alternate embodiment of FIG. 1.
Figure 8:
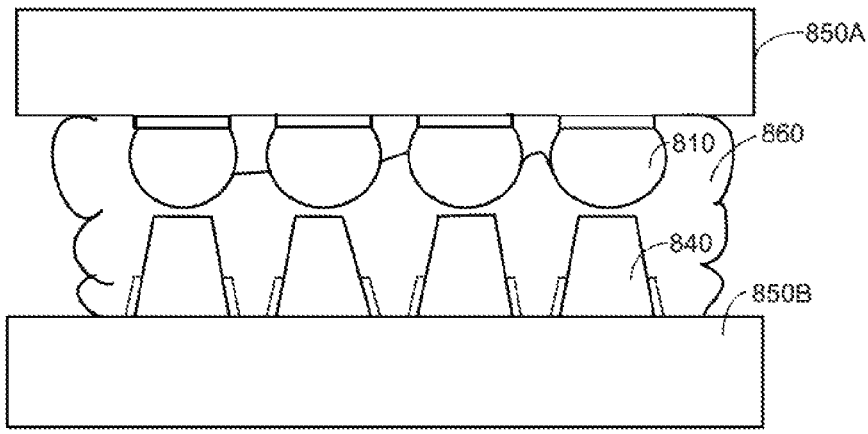
Figure 8:
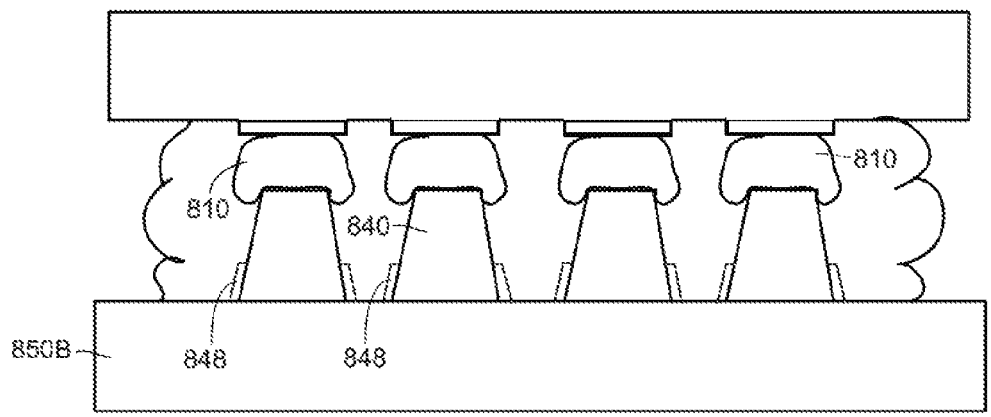
Figure 8:
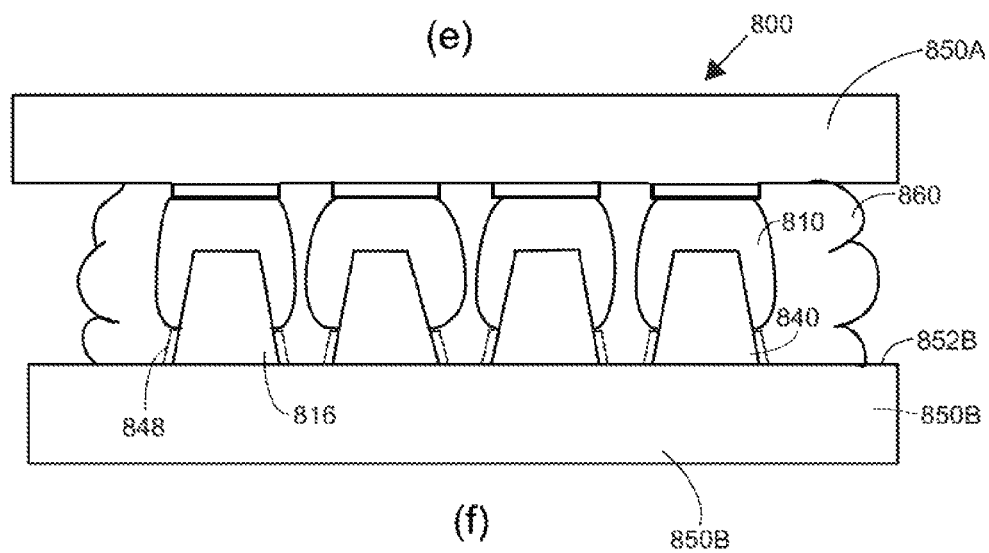

It is to be appreciated that numerous modifications can be made to the embodiment of FIG. 1, some of which will be described in more detail herein. For example, the underfill 60 may be deposited over the top surface 32 of the microelectronic element 30 (FIG. 4), as opposed to the dielectric element 50, or may be deposited on both the microelectronic element 30 and dielectric element 50 (FIG. 8). A solder mask may alternatively be deposited onto the dielectric element 50 (FIG. 3(*a*)) or the conductive posts 40 may be coated, so as to limit the amount of underfill 60 and solder 10 that directly contacts the surface of either the dielectric element 50 or microelectronic element 30 (FIG. 8). The solder mask or coating may also prevent the underfill 60 from contacting the edges of the conductive posts extending from either the surface 32 of the microelectronic element 30 or surface 52 of the dielectric element 50. Instead of the solder or other bond metal 10 being placed directly on the bond pads 20, solder may alternatively be directly placed on one or more tips 42 of the conductive posts 40 (FIG. 6).

Figure 3:
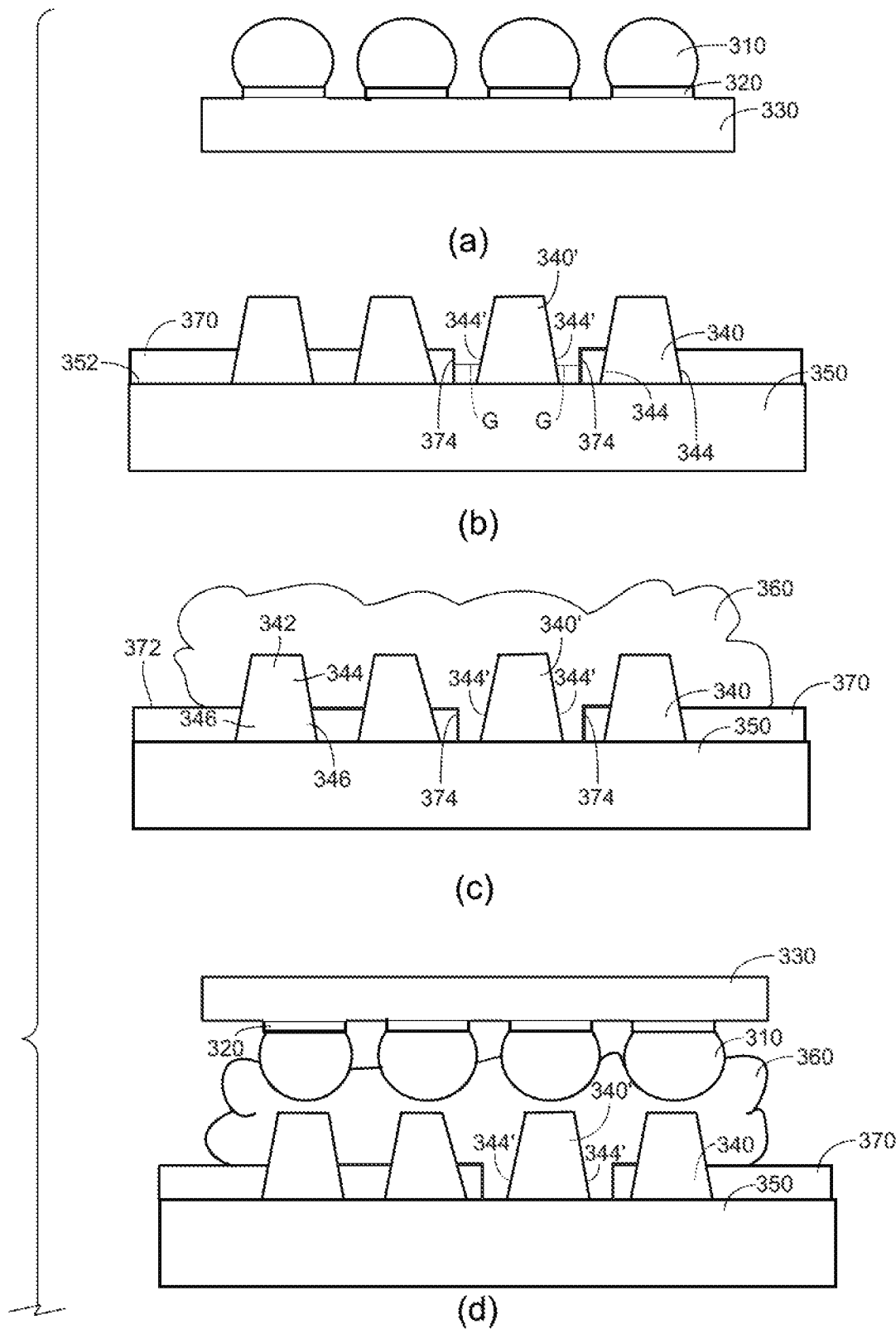
FIG. 3(a-g) is an alternate embodiment of FIG. 1.
Figure 3:
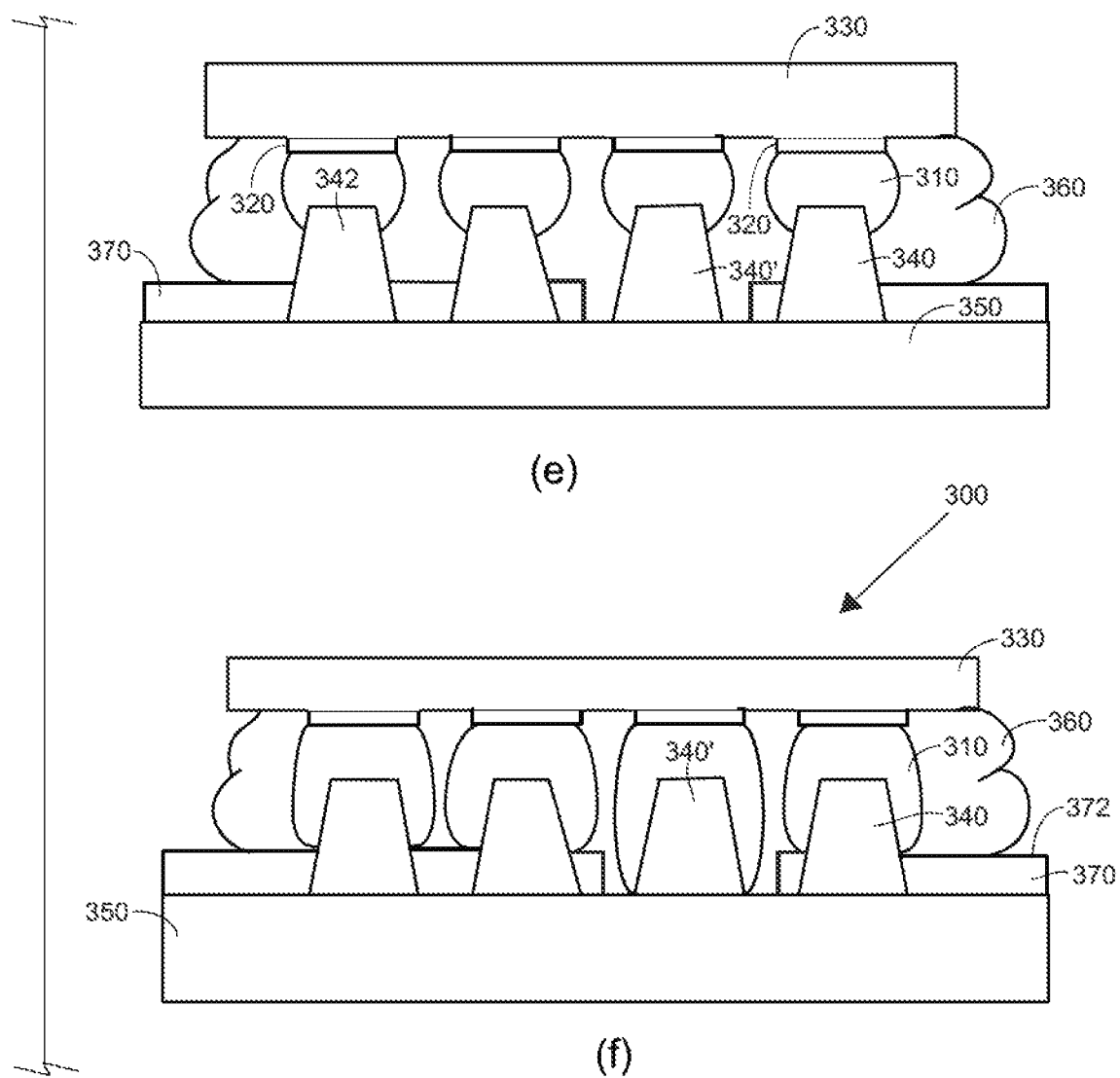
Figures 3, 3G:
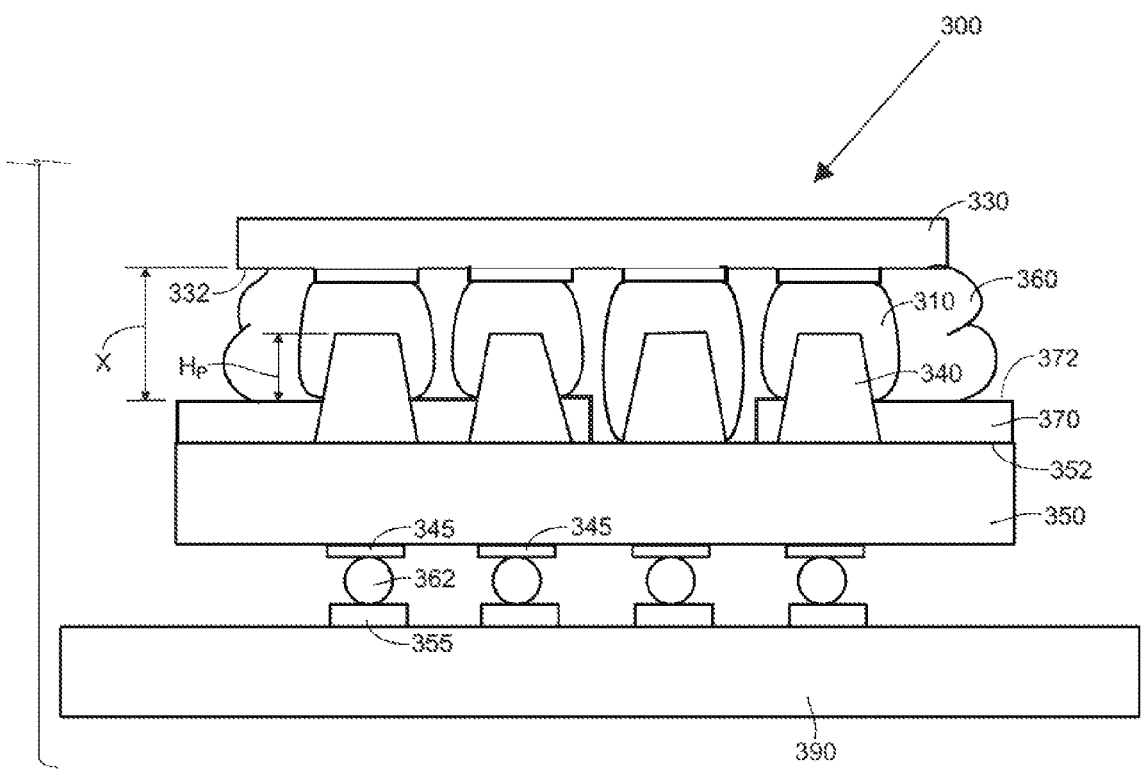

Referring now to FIG. 3, an alternative embodiment for a method of making the microelectronic package 300 (FIG. 3(*f*)) is shown. This embodiment is similar to the one shown in FIG. 2 and follows the same steps, starting with a microelectronic element 330 having a bond metal 10 thereon (FIG. 3(*a*)) and a dielectric element 350 with posts 340 thereon (FIG. 3(*b*)). The method of claim 3 only differs to the extent that a solder mask 370 (FIG. 3(*b*)) is provided on the major surface 352 of the dielectric element 350, which affects how much of the underfill 360 and solder 310 can directly contact the conductive posts 340 and the surface 352 of the dielectric element 350. In the example shown in FIG. 3(*b*), the solder mask 370 may be provided across the top surface 352 of the dielectric element 350, such that the solder mask 370 contacts the side edges 344 of the conductive post 340. Alternatively, the solder mask may be spaced a distance from the edge 344' of the conductive post 340', such that there is a gap G between the edge 374 of the solder mask 370 and the edge 344' of the conductive post 340'.

As shown in FIG. 3(*c*), the underfill 360 is permitted to flow over an exposed top surface 372 of the solder mask 370. As the solder mask 370 is deposited over the dielectric element 350, the underfill 360 will not contact the edge surfaces 344 of the lower portions or bases 346 of the conductive posts 340. The underfill 360 may therefore overlie and contact the tips 342 of the conductive posts, and the edge surfaces 344 of the conductive posts 340 that remain exposed and extend upwardly from the solder mask 370.

As shown in FIG. 3(*e*), after the dielectric element 350 and microelectronic element 330 are joined together (FIG. 3(*d*)), the solder 310 deposited on the bond pads 320 of the microelectronic element 330 may be deformed by the conductive posts or the conductive posts 340 may become embedded in the solder as the microelectronic element 330 is moved towards the tips 342 of the conductive posts 340 on the dielectric element 350. Once the tips 342 of the conductive posts 340 deform or become embedded in the solder 310, the package 300 can be reflowed. In the example shown, the solder mask 370 prevents solder 310 from wetting the edges of the base 346 of the conductive post 340 which are in direct contact with the solder mask 370. Only the exposed portions of the conductive posts 340 extending above the surface 372 of the solder mask 370 are wetted by solder 310.

Referring now to FIG. 3(*f*), after the solder 10 and conductive posts 340 have been joined together, the overall microelectronic package 300 may be heated to a reflow temperature so that the solder 310 may flow along the edges of the conductive post 340 to form a conductive column 390. As shown, because the solder mask 370 is deposited adjacent the edges 344 of the base 346 of the conductive post 340, the solder 310 will only flow along and contact those edges of the conductive post 340 extending away from and exposed above the surface 372 of the solder mask 370. In contrast, where the solder mask 370 does not touch the edge of the conductive post 340', the solder 310 may reflow to the base of the conductive post 340' or adjacent the top surface of the dielectric element 350.

Referring to FIG. 3(*g*) and similar to the previous embodiments, the height $H_p$ of the conductive posts 40 is measured from the top surface 372 of the solder mask 370 to the top surface of the conductive post 340. The height Hp may be at least forty percent (40%) of a separation distance X between the top surface 332 of the microelectronic element 330 and the exposed top surface 372 of the solder mask 370. In one example, where the distance X can be 25 to 100 microns, the conductive posts 40 have a height of at least 10 microns.

Still referring to FIG. 3(*g*), once the microelectronic package 300 is completed, it may be electrically connected to a circuit panel 390 or circuit board. Terminals 345 on the dielectric element 350 are electrically connected with the posts 340 or other conductive elements exposed at surface 352 thereof. As shown, solder balls 362 may be used to connect the terminals 345 to contact pads 355 on the circuit panel. As an alternative to the use of solder balls 362, any other conventional form of conductively connecting the microelectronic package 300 to the circuit panel 390 may be used, such as conductive pins, other forms of conductive material, or the like. It is to be appreciated that the microelectronic package 300 can be electrically connected to any other form of external element or device.

Figure 4:
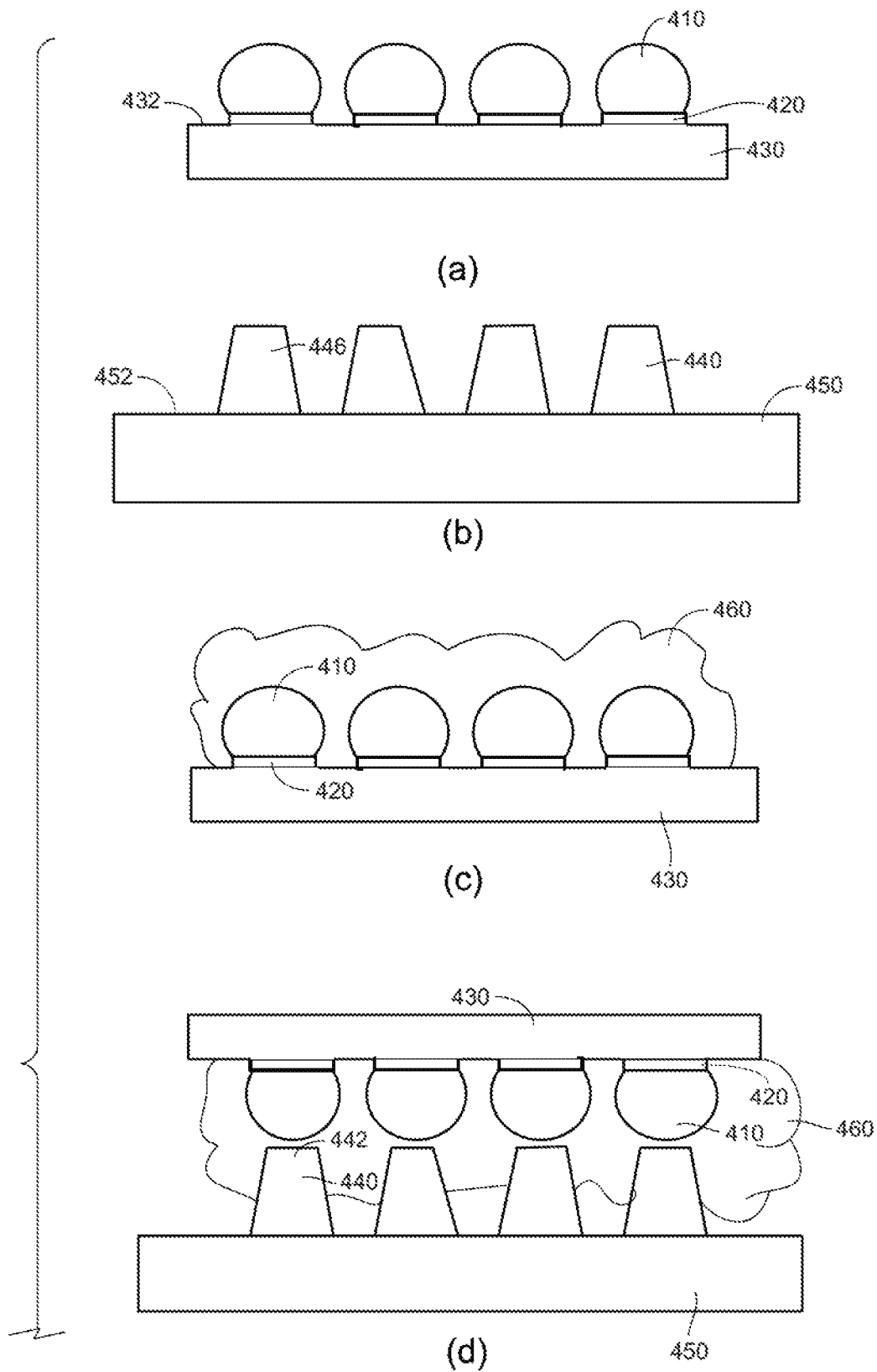
FIG. 4(a-f) is an alternate embodiment of FIG. 1.
Figure 4:
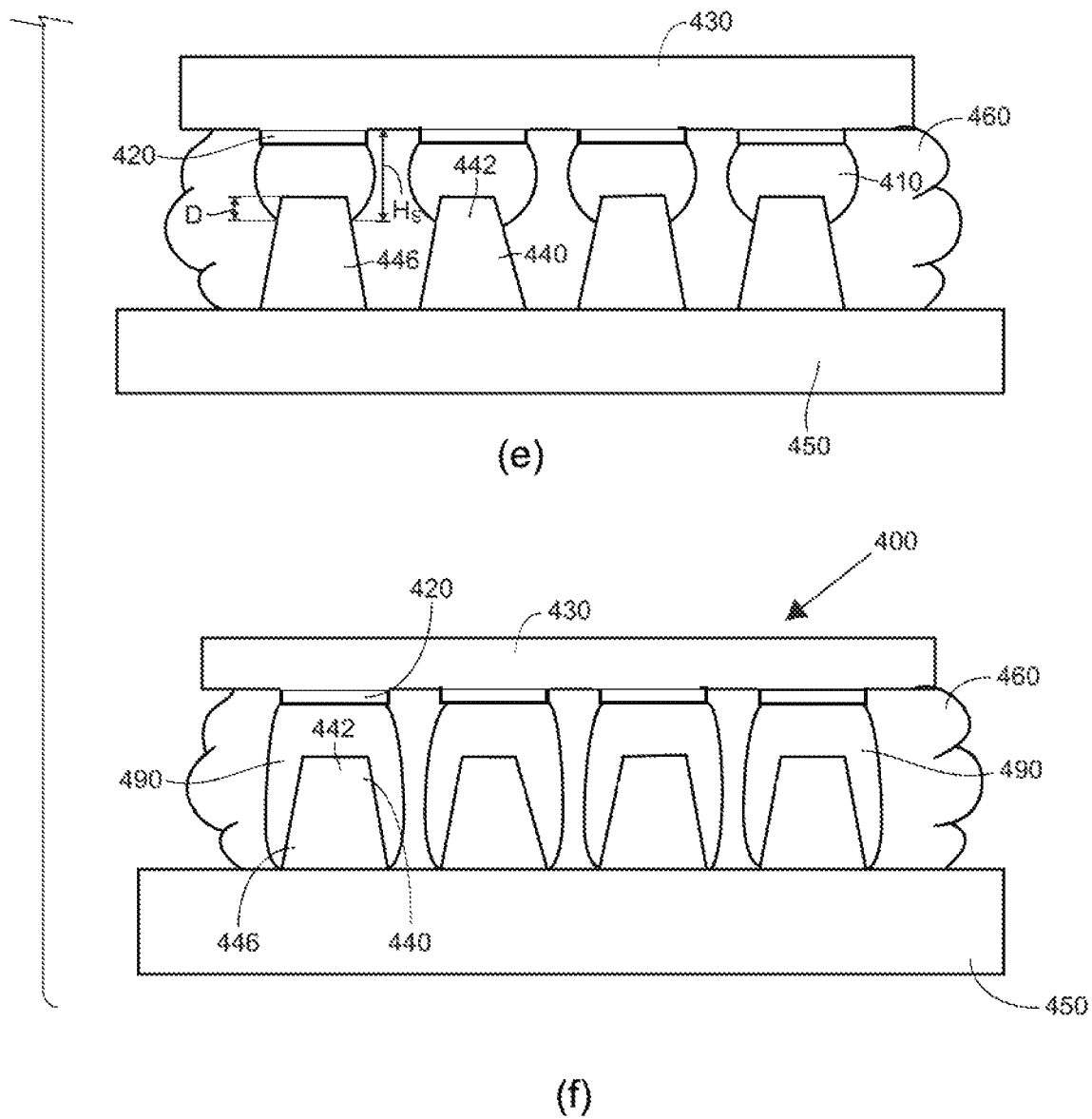

In FIGS. 4(*a*)-(*f*), another alternative embodiment of a microelectronic package 400 (FIG. 4(*f*)) in accordance with the present invention is shown. This embodiment is similar to the method described above with respect to FIGS. 1-2, except that, as shown in FIG. 4(*c*), the underfill 460 may alternatively be provided on the top surface 432 of the microelectronic element 430, and may not be provided on the top surface 452 of dielectric element 450. Referring to FIG. 4(*d*), once the solder 410 on the microelectronic element 430 and the conductive posts 440 are juxtaposed with one another and brought closer together, the tips 442 of the conductive posts 440 begin to penetrate through the underfill 460. In one embodiment, during this step, the underfill 460 will extend from the contact-bearing surface 432 of the microelectronic element 430 to contact the conductive posts 440.

One or both of the microelectronic element 430 and dielectric element 450 can then be moved toward the other so that the conductive posts 440 can push through the underfill 60 and at least deform, if not also become embedded within, the solder 410. In the embodiment shown, the tips 442 of the posts extend just into the solder 410, a distance D that is at least 25% of the total height $H_s$ of the solder 410 and conductive pad 420. Thereafter, the package 400 can be reflowed such that the solder 410 flows along the exposed edges of the conductive post 440. As shown, because there is no solder mask or other coating on the conductive post 440 that would prevent wetting of the post by the solder, the solder 410 flows along the conductive post 440 and may form a conductive column 490 of solder that extends from the bond pad 420 on the microelectronic element to the base 446 of the conductive post 440 extending upwardly from the dielectric element 450.

Figure 5:
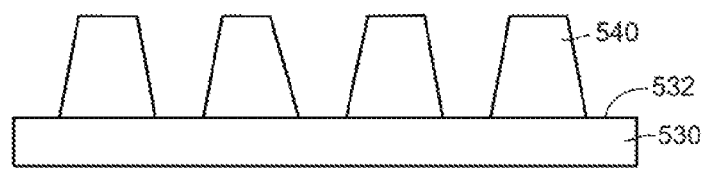
FIG. 5(a-f) is another alternate embodiment of FIG. 1.
Figure 5:
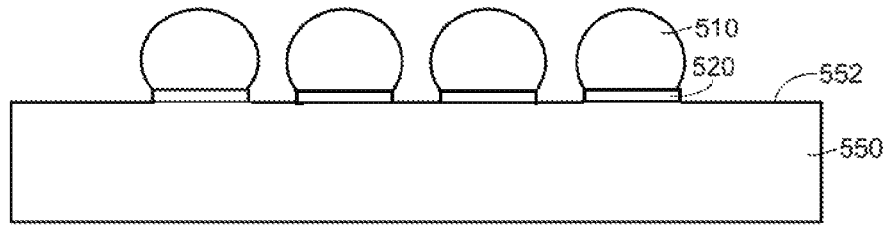
Figure 5:
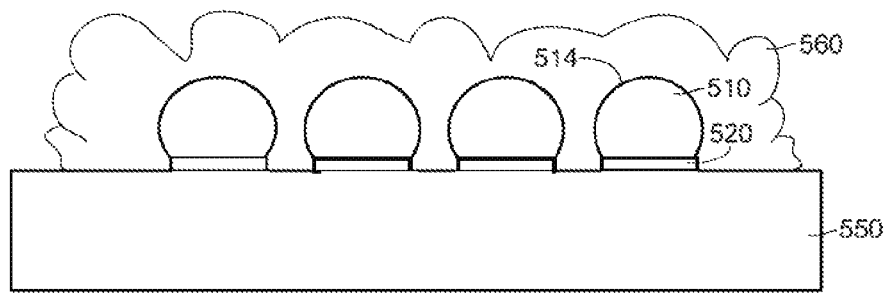
Figure 5:
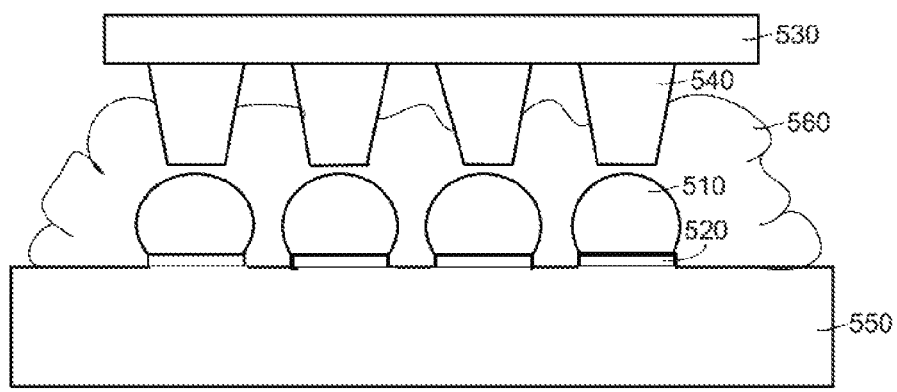
Figure 5:
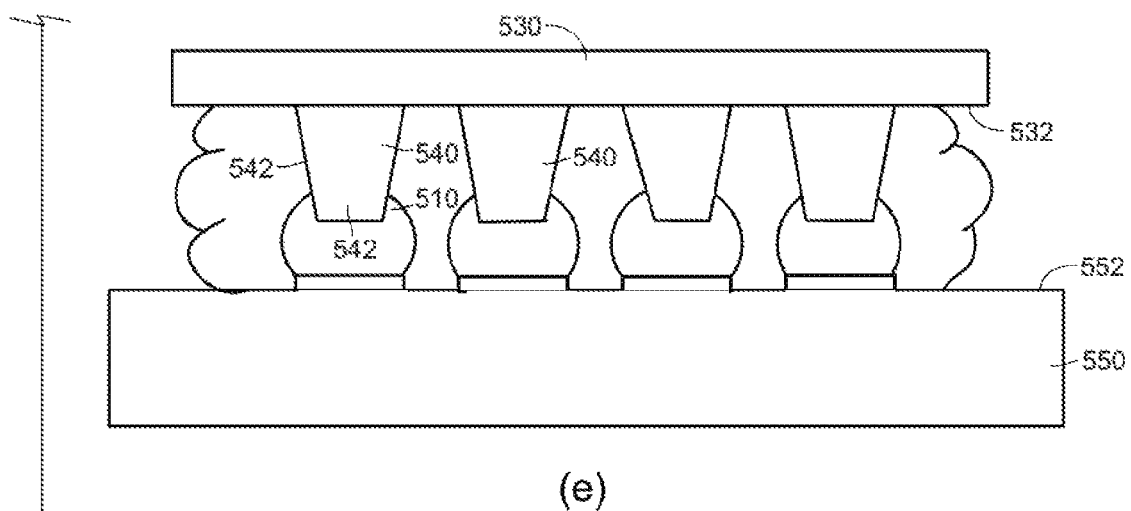
Figure 5:
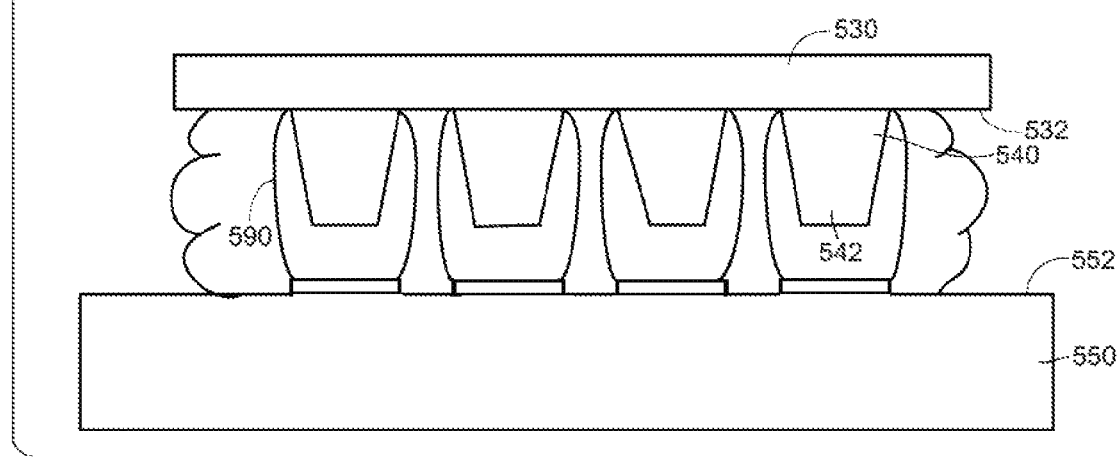

Referring now to FIG. 5, an alternative embodiment of FIGS. 1(a)-1(f) is shown. This embodiment is similar to the one shown in FIGS. 1(a)-1(f), but differs in that, in the initial component (FIG. 5(a)), the conductive posts 540 extend away from the contact-bearing surface 532 of the microelectronic element 530, as opposed to extending away from the surface 552 of the dielectric element 550. Similarly, solder 510 may extend from bond pads 520 exposed at the top surface 552 of the dielectric element 550 (FIG. 5(b)), and not the microelectronic element 530 as in previous embodiments.

For ease of reference, directions are stated in this disclosure with reference to a "top", i.e., contact-bearing surface 532 of a semiconductor chip. Generally, directions referred to as "upward," "rising from" or "extending from" shall refer to the direction orthogonal and away from the microelectronic element top surface 532. Directions referred to as "downward" shall refer to the directions orthogonal to the element top surface 532 and opposite the upward direction. A "vertical" direction shall refer to a direction orthogonal to the chip top surface. The term "above" a reference point shall refer to a point upward of the reference point, and the term "below" a reference point shall refer to a point downward of the reference point. It is to be further appreciated that similar reference numerals will be used to describe similar elements.

The method steps are otherwise similar to those previously discussed herein. Referring to FIG. 5(c), an underfill 560 may be provided over the bonding metal, e.g., solder 510 extending from the dielectric element 550. In this embodiment, the underfill 560 also covers the surfaces 514 of the solder 510 in its entirety. Turning to FIG. 5(d), the conductive posts 540 can be juxtaposed with the solder 510, such that the conductive posts 540 are able to become embedded within or penetrate through the underfill 560. As shown in FIG. 5(e) and discussed in previous embodiments, the tips 542 of the conductive posts 540 extend through the solder 510. Once reflowed, the underfill 560 can contact the exposed edges 544 of the conductive post 540. Similar to the embodiment described above with reference to FIG. 1(f), the solder may contact a portion of or all of the height Hc of the post above the surface 532 of the microelectronic element. In an exemplary embodiment, the solder may contact at least half of the height of the post from the surface 532. As particularly shown in FIG. 5(f), when there is no solder mask and/or other material coated on the conductive posts that would prevent the solder 510 from wetting any portions of the conductive post 540, a conductive column 590 of solder can, in one embodiment, extend from the contact-bearing surface 532 of the microelectronic element 530 to the contacts 520 exposed at the surface 552 of the dielectric element 550.

Referring now to FIG. 6, another method of making a microelectronic package 600 (FIG. 6(e)) in accordance with the present invention is shown. The method is similar to those previously disclosed herein, but differs to the extent that conductive posts 640A extend from the microelectronic element 630 (FIG. 6(a)) and conductive posts 640B also extend from the dielectric element 650 (FIG. 6(b)). Furthermore, solder 610 may be deposited directly on the tips 642 of the conductive post 640A and solder mask 680 may be provided adjacent the conductive posts 640A. For example, an exposed layer of silicon nitride can serve as a mask 680 to avoid wetting of the surface 632 of the microelectronic element 630 by a bond metal such as solder.

As shown in FIG. 6(c), an underfill 660 is deposited over the conductive posts 640 extending from the top surface 652 of the dielectric element 650. The conductive posts 640A and conductive posts 640B may then be juxtaposed with one another (FIG. 6(d)). The tips 642 of the conductive posts 640A, as well as the solder 610 on the tips 642 thereof, may be pressed into the underfill 660, such that the tips 642 and solder 610 thereon may extend into at least a portion of the underfill 660. The dielectric element 650 and microelectronic element 630 may continue to be pressed together (or one toward the other) until the tips 642B are able to penetrate into at least a portion of the solder 610, such that at least 25% of the original height $H_s$ of the solder 610 (FIG. 1(e)) is penetrated by the conductive post 640B. (FIG. 6(e).) Thereafter, the package may be reflowed to cause the solder 610 deposited on the tip 642A of the conductive post 640A to flow and wet the edges of both conductive posts 640A,640B (FIG. 6(f)). In this embodiment, as shown in FIG. 6(f), because a limited amount of solder 610 is deposited on the tips 642A of the conductive posts 640A, the solder 610 may not fully wet the respective edges 644A,644B of the respective conductive posts 640A, 640B. As shown, the base 646 of the conductive posts 640B may remain exposed and capable of being in direct contact with the underfill 660.

Figure 7:
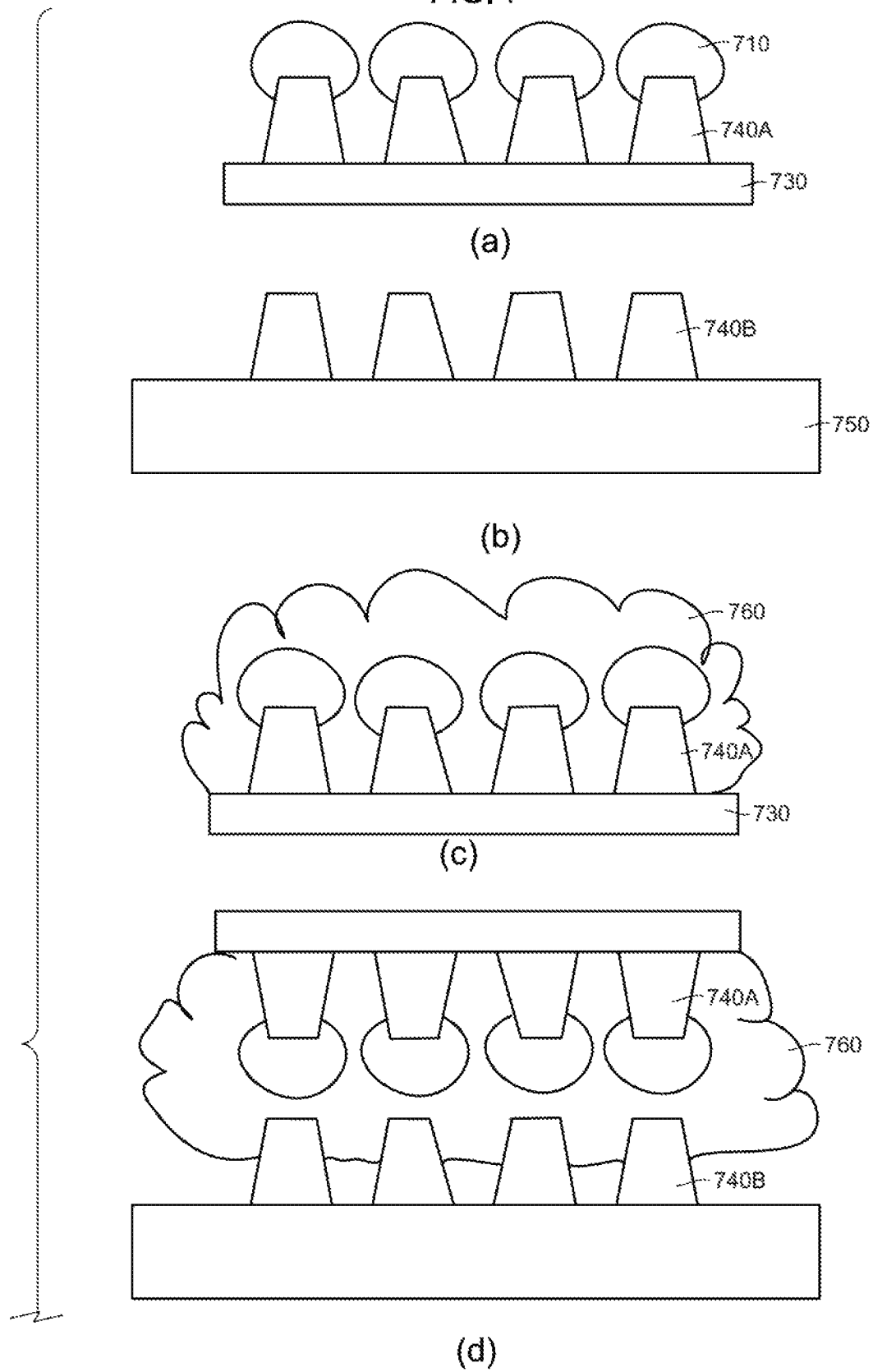
FIG. 7(a-f) is an alternate embodiment of FIG. 6.
Figure 7:
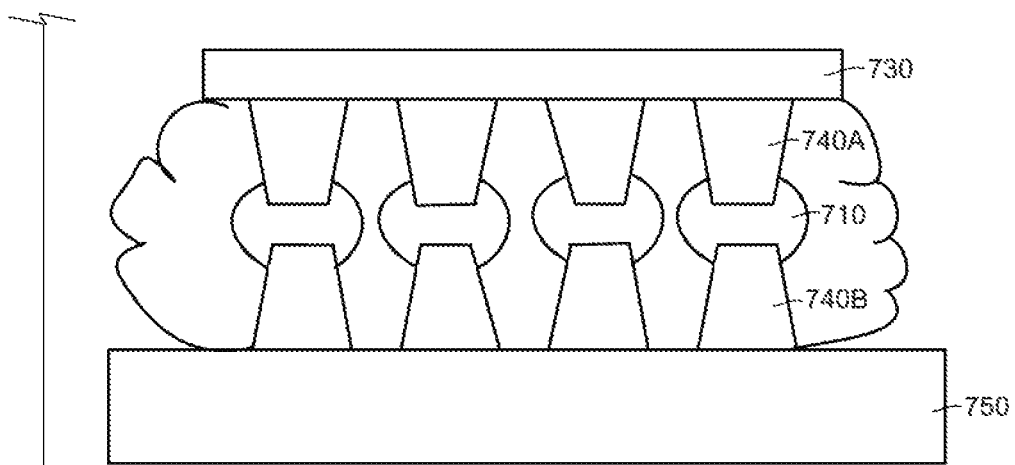
Figure 7:
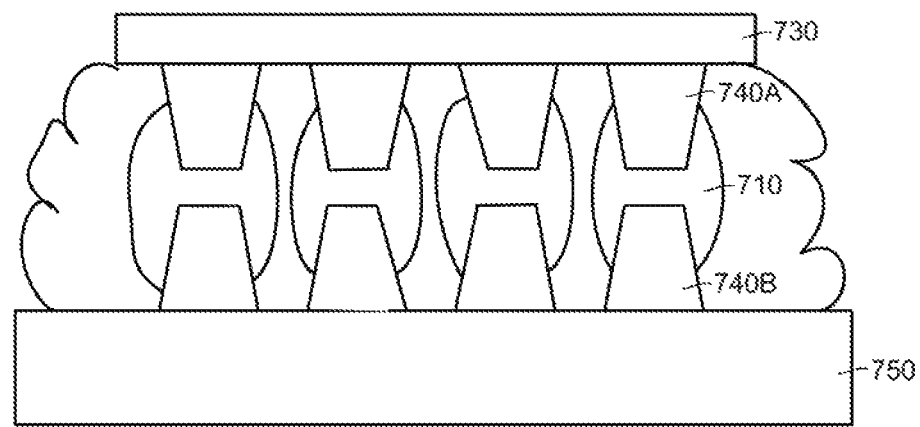

Referring now to FIG. 7, an alternative method of FIG. 6 is shown. In this embodiment, dielectric element 750 (FIG. 7(b)) also supports posts 740B. However, in contrast to the embodiment of FIG. 6, there is no solder mask that extends along the length of microelectronic element 630 (FIG. 7(a)). The underfill 760 is deposited over the exposed portions of the contact-bearing surface 732 of the microelectronic element 730, as well as the exposed portions of the conductive post 740A that are not covered by the solder 710. In the embodiment shown, the underfill preferably extends beyond the outer edges of each of the conductive posts 740A. (FIG. 7(c).) It is to be appreciated that in alternative embodiments, the solder may instead be placed on the conductive post extending from the dielectric element 750.

Turning now to FIG. 7(d), the conductive posts 740A and solder 710 extending therefrom, as well as the conductive posts 740B extending from the dielectric element 750 are juxtaposed with one another. The dielectric element 750 and microelectronic element 730 can be pressed together so that the conductive posts 740B enter the underfill 760.

As further seen in FIG. 7(e), once the conductive posts 740B penetrate through the underfill 760, the dielectric element 750 and microelectronic element 730 can continue being compressed until the conductive posts 740B are embedded within the solder exposed at the conductive tips 742A of the conductive post 740A extending from the microelectronic element 730. The package can then be reflowed so that the solder 710 will wet the edges of the exposed surfaces of the conductive posts 740A and 740B (FIG. 7(f)).

Referring now to FIG. 8, another microelectronic package 800 (FIG. 8(e)) in accordance with the present invention is shown. As shown, the microelectronic package includes two dielectric elements 850A (FIG. 8(a)) and 850B (FIG. 8(b)) that are substantially the same length. Referring to FIGS. 8(c1) and 8(c2), an underfill layer can be deposited over the top surfaces 852A, 852B of the respective dielectric elements 850A and 850B. The dielectric element 850B may include conductive posts 840 extending away from the top surface 852B of the dielectric element 850. The bases 846 of the conductive posts 840 may be coated with a material, such as a solder mask material or any organic or inorganic material that can help to prevent wetting of the conductive posts by solder or other material.

As shown in FIG. 8(d), the conductive posts 840 can be juxtaposed with solder 810 extending from the dielectric element 850A. Referring to FIG. 8(e), the dielectric elements 850A and 850B can continue to be moved closer together to place the conductive post 840 in contact with the solder 810. In this embodiment, the solder 810 is not pierced or penetrated by the conductive post 840. As shown, the conductive posts 840 only deform the solder 810 extending from the dielectric element 850A. Turning to FIG. 8(f), once the package is reflowed, the solder 810 will flow along the edges of the conductive post 840 except where coated by the material 848 to prevent wetting of the bases 846 of the conductive posts 840.

Figure 9:
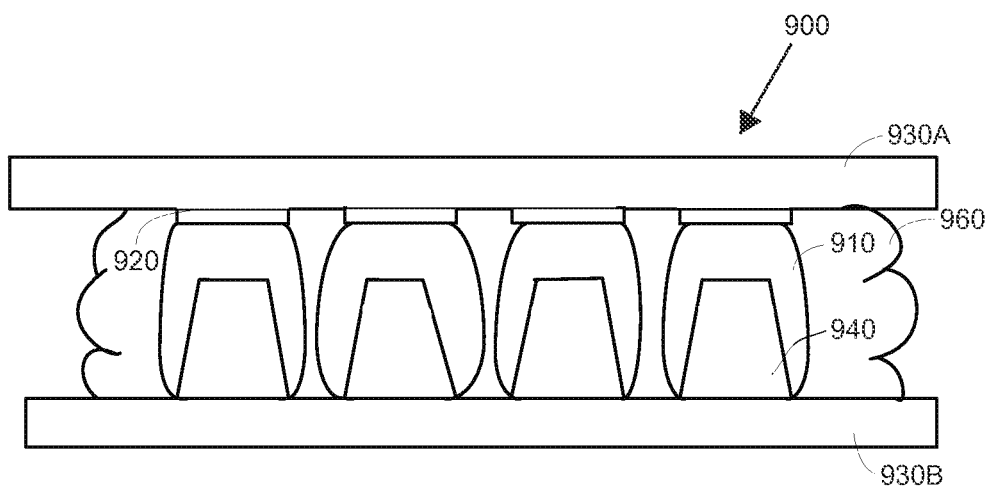
FIG. 9 is an alternate embodiment of a portion of FIG. 1F.

Referring to FIG. 9, another alternative microelectronic package 900 is shown. This embodiment is similar to the prior methods of creating a microelectronic package, and only differs to the extent that the conductive elements (i.e., conductive posts 940, solder 910, and conductive posts 920) are supported by respective microelectronic elements 930A, 930B, and none extend from a dielectric element. The underfill 960 encapsulates the interior of the package between the two microelectronic elements 930A,930B.

Figure 10:
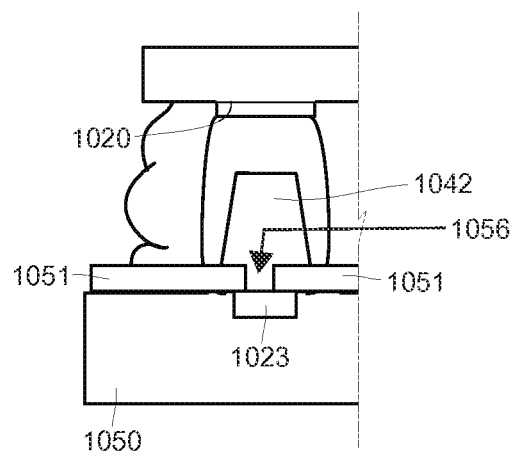
FIG. 10 is a system in accordance with an embodiment of the invention.

Referring to FIG. 10, another alternative portion of a microelectronic assembly is shown. FIG. 10, which is an alternative view of a portion of FIG. 1(f), shows that a conductive pad 1023 may be positioned on or within a first dielectric element 1050. A dielectric layer 1051 can be formed over dielectric element 1050 and an opening 1056 can be formed therein. The conductive post 1042 can be formed by plating up through the opening and forming a post, or alternatively, depositing a continuous metal layer over the dielectric layer 1051 and within the opening 1056 and then etching the continuous metal layer to form the desired post size and shape.

Figure 11:
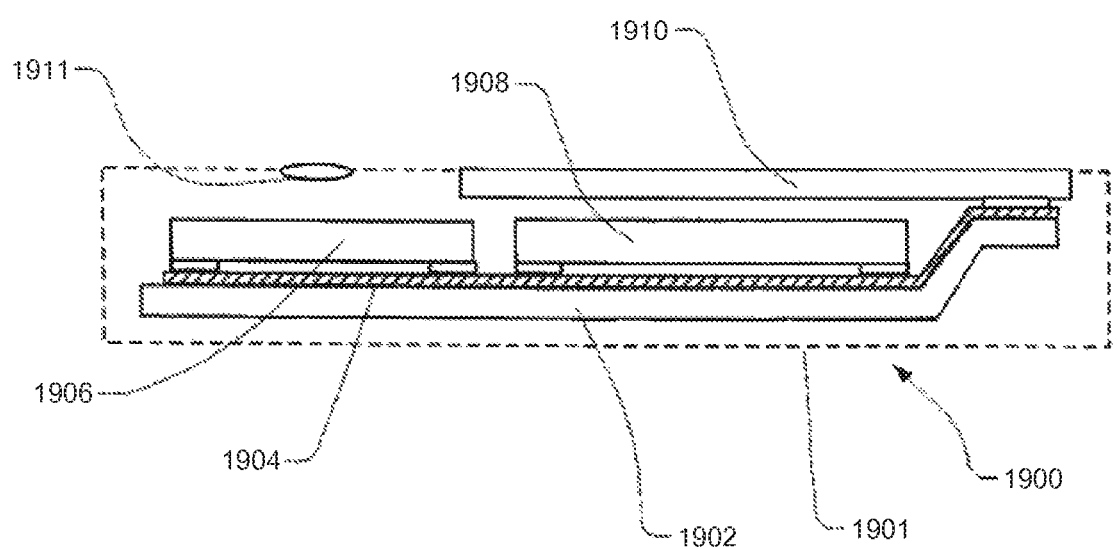
FIG. 11 is a schematic depiction of a system according to one embodiment of the invention.

The various microelectronic assemblies discussed above can be utilized in construction of diverse electronic systems. For example, as shown in FIG. 11, a system 1900 in accordance with a further embodiment of the invention includes a structure 1906 as described in the prior embodiments of microelectronic assemblies above in conjunction with other electronic components 1908 and 1910. In the example depicted, component 1908 is a semiconductor chip whereas component 1910 is a display screen, but any other components can be used. Of course, although only two additional components are depicted in FIG. 11 for clarity of illustration, the system may include any number of such components. The structure 906 as described above may be, for example, a composite chip or a structure incorporating plural chips. In a further variant, both may be provided, and any number of such structures may be used. Structure 1906 and components 1908 and 1910 are mounted in a common housing 1901, schematically depicted in broken lines, and are electrically interconnected with one another as necessary to form the desired circuit. In the exemplary system shown, the system includes a circuit panel 1902 such as a flexible printed circuit board, and the circuit panel includes numerous conductors 1904, of which only one is depicted in FIG. 11, interconnecting the components with one another. However, this is merely exemplary; any suitable structure for making electrical connections can be used. The housing 1901 is depicted as a portable housing of the type usable, for example, in a cellular telephone or personal digital assistant, and screen 1910 is exposed at the surface of the housing. Where structure 1906 includes a light-sensitive element such as an imaging chip, a lens 1911 or other optical device also may be provided for routing light to the structure. Again, the simplified system shown in FIG. 11 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly, comprising:
a first component having a first surface and first conductive elements projecting above the first surface;
a second component having a second surface and second conductive elements projecting above the second surface;
at least one of the first or second components being a microelectronic element, at least some of the first conductive elements or at least some of the second conductive elements being substantially rigid conductive posts, the posts having a height above the respective surface from which the posts project;
a bond metal disposed between respective pairs of conductive elements, the respective pairs each including at least one of the posts and at least one of the first or second conductive elements confronting the at least one post, the bond metal contacting edges of the posts along at least one half the height of the posts; and
an underfill layer contacting and bonding the first and second surfaces of the first and second components, wherein a residue of the underfill layer is present at at least one of interfacial surfaces between at least some of the posts and the bond metal or is present within the bond metal.

2. The microelectronic assembly of claim 1, wherein the residue of the underfill layer is present within the bond metal.

3. A system comprising an assembly as in claim 1 and one or more other electronic components electrically connected to the assembly.

4. The system as claimed in claim 3 further comprising a housing, the assembly and the other electronic components being mounted to the housing.

5. The microelectronic assembly of claim 1, wherein the residue of the underfill layer is present at the at least one of the interfacial surfaces between at least some of the posts and the bond metal.

6. The microelectronic assembly of claim 5, wherein the first conductive elements are the conductive posts.

7. The microelectronic assembly of claim 5, wherein the second conductive elements are the conductive posts.

8. The microelectronic assembly of claim 5, wherein both the first conductive elements and the second conductive elements are the conductive posts.

9. The microelectronic assembly of claim 5, wherein a solder mask is provided adjacent the conductive posts.

10. The microelectronic assembly of claim 5, wherein at least a portion of the conductive posts is coated with a material resistant to a bonding metal.

11. The microelectronic assembly of claim 5, wherein the bond metal covers one half or less of a height of at least one of the conductive posts.

12. The microelectronic assembly of claim 5, wherein the first component is a dielectric element.

13. The microelectronic assembly of claim 12, wherein a bonding metal is deposited on at least one of the conductive posts.

14. The microelectronic assembly of claim 5, wherein the first component and the second component are microelectronic elements.

15. The microelectronic assembly of claim 14, wherein a bonding metal is deposited on at least one of the conductive posts.

16. The microelectronic assembly of claim 14, wherein the second conductive elements are the conductive posts.

17. The microelectronic assembly of claim 5, wherein the first component is a microelectronic element and the second component is a dielectric element.

18. The microelectronic assembly of claim 17, wherein the microelectronic element is a chip.

19. The microelectronic assembly of claim 17, wherein a bonding metal is deposited on at least one of the conductive posts.

20. The microelectronic assembly of claim 17, wherein the second conductive elements are the conductive posts.

\* \* \* \* \*